(12) United States Patent
Dan et al.

(10) Patent No.: US 11,950,070 B2
(45) Date of Patent: Apr. 2, 2024

(54) SOUND PRODUCTION DEVICE

(71) Applicant: AAC Kaitai Technologies (Wuhan) CO., LTD, Hubei (CN)

(72) Inventors: Qiang Dan, Shenzhen (CN); Yu Shen, Shenzhen (CN); Shiyang Cheng, Shenzhen (CN); Yiwei Zhou, Shenzhen (CN); Yang Li, Shenzhen (CN)

(73) Assignee: AAC KAITAI TECHNOLOGIES (WUHAN) CO., LTD, Wuhan (CN)

( * ) Notice: Subject to any disclaimer, the term of this patent is extended or adjusted under 35 U.S.C. 154(b) by 0 days.

(21) Appl. No.: 17/875,390

(22) Filed: Jul. 27, 2022

(65) Prior Publication Data
US 2023/0217174 A1 Jul. 6, 2023

(30) Foreign Application Priority Data
Dec. 31, 2021 (CN) .......................... 202111674508.6

(51) Int. Cl.
*H04R 7/06* (2006.01)
*G10K 9/22* (2006.01)
*H04R 7/10* (2006.01)
*H04R 9/02* (2006.01)
*H04R 19/00* (2006.01)
*H10N 30/20* (2023.01)

(52) U.S. Cl.
CPC ................ *H04R 7/06* (2013.01); *H04R 9/02* (2013.01); *G10K 9/22* (2013.01); *H04R 7/10* (2013.01); *H04R 19/005* (2013.01); *H10N 30/2042* (2023.02)

(58) Field of Classification Search
CPC . H04R 7/06; H04R 9/02; H04R 17/00; H04R 17/02; H04N 2/001; H10N 30/2042; H03H 9/02338
See application file for complete search history.

(56) References Cited

U.S. PATENT DOCUMENTS

| 5,856,956 A * | 1/1999 | Toki ....................... H04R 17/00 367/160 |
| 2006/0202592 A1 * | 9/2006 | Ruggeri ................. H02N 2/186 310/349 |

(Continued)

FOREIGN PATENT DOCUMENTS

KR 20160079434 A * 7/2016

*Primary Examiner* — Carolyn R Edwards
*Assistant Examiner* — Kuassi A Ganmavo
(74) *Attorney, Agent, or Firm* — W&G Law Group

(57) ABSTRACT

A sound production device includes a substrate having a cavity and a plurality of cantilever diaphragms fixed on the substrate. Each of the plurality of the cantilever diaphragms includes a fixed end fixed on the substrate and a free end extending from the fixed end to a position suspended above the cavity. The free end includes a first surface and a second surface oppositely arranged. The free end and the substrate or other free ends are spaced to form a gap. The sound production device further includes a first dielectric elastomer actuator, a second dielectric elastomer actuator, and a flexible connector. The sound production device of the present disclosures adopts dielectric elastomer actuators on both of the upper and lower sides of the cantilever diaphragms to together act on the cantilever diaphragms, thereby improving the linearity of the sound production device.

6 Claims, 5 Drawing Sheets

(56) References Cited

U.S. PATENT DOCUMENTS

| | | | |
|---|---|---|---|
| 2010/0219722 A1* | 9/2010 | Onishi | H04R 17/00 310/348 |
| 2012/0099746 A1* | 4/2012 | Fujise | H04R 17/00 381/190 |
| 2013/0083630 A1* | 4/2013 | Onishi | H04R 17/00 310/322 |
| 2013/0287233 A1* | 10/2013 | Kong | H04R 17/00 381/190 |
| 2013/0307371 A1* | 11/2013 | Sakashita | H10N 30/852 310/300 |
| 2018/0035200 A1* | 2/2018 | Abe | H04R 1/2811 |
| 2018/0179048 A1* | 6/2018 | Schenk | H04R 9/02 |
| 2018/0234773 A1* | 8/2018 | Kaplan | H04R 3/12 |
| 2018/0366424 A1* | 12/2018 | Borrego Lambin Torres Amaral | B81B 7/0025 |
| 2020/0100033 A1* | 3/2020 | Stoppel | H04R 31/003 |
| 2020/0314555 A1* | 10/2020 | Pfaffinger | H04R 5/02 |
| 2023/0007400 A1* | 1/2023 | Kagawa | H10N 30/852 |

\* cited by examiner

SOUND PRODUCTION DEVICE

TECHNICAL FIELD

The present disclosure relates to the field of electroacoustic conversion, and in particular to a sound production device.

BACKGROUND

Existing sounding devices generally include a vibration system and a magnetic circuit system, and the vibration system includes a diaphragm and a voice coil configured to drive the diaphragm to vibrate and then generate sounds, thus resulting in a complex structure and a large size structure. And, the micro speaker which adopted Micro Electro Mechanical Systems (MEMS) typically use piezoelectric structures to simplify structures and thinner size compared with the above electromagnetic speakers. However, a piezoelectric material is expensive, thus resulting in a higher cost.

SUMMARY

The present disclosure aims to provides a sound production device to solve, at least in part, deficiencies in the related art.

In order to achieve above aims, the present disclosure provides a sound production device including a substrate having a cavity and a plurality of cantilever diaphragms fixed on the substrate. Each of the plurality of the cantilever diaphragms includes a fixed end fixed on the substrate and a free end extending from the fixed end to a position suspended over the cavity. The free end includes a first surface and a second surface where the first surface is opposite to the second surface, the free end is spaced with the substrate or one other the free end to form a gap. The sound production device further includes at least one first dielectric elastomer actuator disposed on the first surface, at least one second dielectric elastomer actuator disposed on the second surface, and a flexible connector fixed on a periphery of the gap to completely cover the gap.

As an improvement, the at least one first dielectric elastomer actuator includes a first electrode layer, a first dielectric elastomer film, and a second electrode layer sequentially stacked on the first surface. The at least one second dielectric elastomer actuator includes a third electrode layer, a second dielectric elastomer film, and a fourth electrode layer sequentially stacked on the second surface.

As an improvement, each of the plurality of the cantilever diaphragms is made of metal or a polymer compound. When one of the plurality of the cantilever diaphragms is made of a conductive metal material, a first insulating layer is disposed between the first surface and the first electrode layer, and a second insulating layer is disposed between the second surface and the third electrode layer As an improvement, each of the cantilever diaphragms is made of a conductive metal material, and the at least one first dielectric elastomer actuator includes a first dielectric elastomer film and a second electrode layer sequentially stacked on the first surface. The at least one second dielectric elastomer actuator includes a second dielectric elastomer film and a fourth electrode layer sequentially stacked on the second surface.

As an improvement, the flexible connector is integrally formed with the first dielectric elastomer film of the at least one the first dielectric elastomer actuator.

As an improvement, each of the second dielectric elastomer film of the at least one second dielectric elastomer actuator are interconnected to form an integral structure.

As an improvement, the flexible connector is a flat or arch shaped structure and is spaced from the at least one first dielectric elastomer actuator.

As an improvement, a drive voltage of the at least one first dielectric elastomer actuator and a drive voltage of the at least one second dielectric elastomer actuator are alternating voltages having a same period and a phase difference of 180°.

As an improvement, the plurality of the cantilever diaphragms are symmetrically distributed around a central axis, and the free end of each of the cantilever diaphragms extends toward a center of the cavity in a tapered manner.

As an improvement, Young's modulus of the first dielectric elastomer film and Young's modulus of the second dielectric elastomer film are from 1 kPa to 100 MPa.

Compared with the related art, the sound production device of the present disclosures adopts dielectric elastomer actuators on both of the upper and lower sides of the cantilever diaphragms to together act on the cantilever diaphragms, thus vibrating to produce sounds, and improving the linearity of the sound production device. Because a voice coil and a magnetic circuit system are omitted, a structure of the sound production device becomes easier and more convenient to assembly, and thickness of the entire vibration component can be as low as 20 um or less. A thinner size sound production device can be obtained.

BRIEF DESCRIPTION OF THE DRAWINGS

The embodiments set forth in the drawings are illustrative and exemplary in nature and not intended to limit the disclosure. The following detailed description of the illustrative embodiments can be understood when read in conjunction with the following drawings, where like structure is indicated with like reference numerals and in which.

DETAILED DESCRIPTION OF EMBODIMENTS

Technical solutions of the embodiments of the present disclosure are clearly and completely described below with reference to the drawings in the embodiments of the present disclosure. Apparently, the described embodiments are merely some rather than all of the embodiments of the present disclosure. All other embodiments obtained by those of ordinary skill in the art based on the embodiments of the present disclosure without creative efforts shall fall within the protection scope of the present disclosure.

Moreover, the term "first", "second" is used only for the purpose of describing, and cannot be understood as an indication or implies a relative importance or the number of indicated techniques. Thus, features with "first", "second" may be indicated or implicitly including one or more of these features. In the description of the invention, the meaning of "multiple", "a number of", "several", "some" is two or more, unless otherwise specifically defined.

Figure 1:
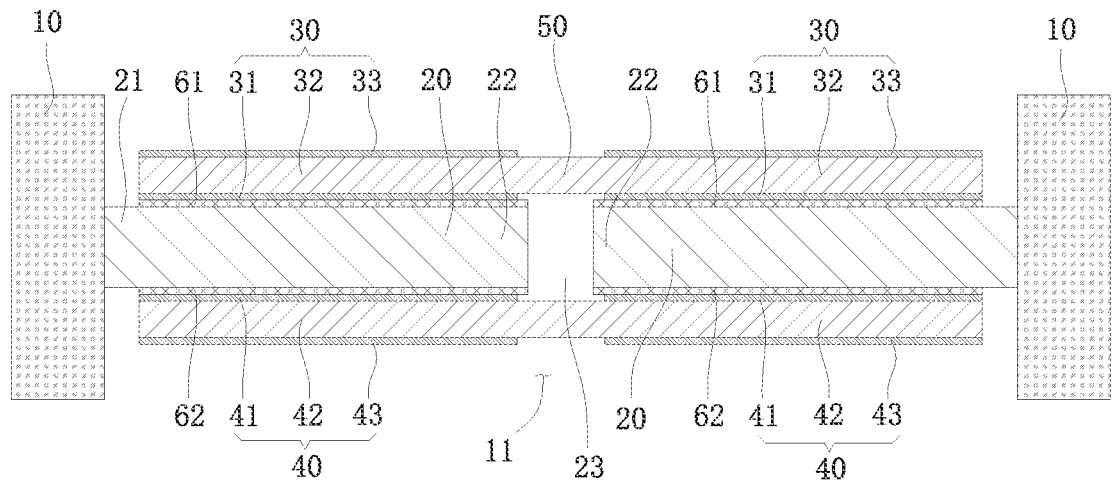
FIG. 1 depicts a structural diagram of a sound production device according to a first embodiment of the present disclosure.

Referring to FIG. 1, a sound production device is provided according to a first embodiment of the present disclosure. The sound production device includes a substrate 10 having a cavity 11 and a plurality of cantilever diaphragms 20 fixed to the substrate 10. Each of the plurality of the cantilever diaphragms 20 includes a fixed end 21 fixed to the substrate 10 and a free end 22 extending from the fixed end 21 to a position suspended over the cavity 11. The free end 22 includes a first surface (namely an upper surface) and the second surface (namely a lower surface) where the first surface is opposite to the second surface. The free end 22 is spaced from an opposite free end 22 to form a gap 23 and the gap 23 is covered by a flexible connector 50.

A first electrode layer 31, a first dielectric elastomer film 32, and a second electrode layer 33 are sequentially stacked on the first surface. A third electrode layer 41, a second dielectric elastomer film 42, and a fourth electrode layer 43 are sequentially stacked on the second surface.

It should be understood that the first electrode layer to the fourth electrode layer are flexible electrodes and made preferably from a material such as graphite powder or carbon-based conductive adhesive. The first dielectric elastomer film 32 and the second dielectric elastomer film 42 are made from polymer compound, thicknesses of which are preferably 0.1 um to 1000 um, rigidity and linear range of the dielectric elastomer films in this thickness range are more suitable. Young's modulus of the first dielectric elastomer film and Young's modulus of the second dielectric elastomer film are from 1 kPa to 100 MPa, elasticity and the rigidity of the dielectric elastomeric films in this membrane range are good, thus polarization of the sound production device is small.

That is, the first electrode layer 31, the first dielectric elastomer film 32, and the second electrode layer 33 above each of the cantilever diaphragms 20 together form a respective first dielectric elastomer actuator 30 (the dielectric elastomer actuator can be read as DEA). The sound production device 10 of the present disclosure includes at least one first dielectric elastomer actuator 30. In the embodiment, multiple first dielectric elastomer actuators 30 are provided, the flexible connector 50 is integrally formed with the first dielectric elastomer film 32 of each of the multiple first dielectric elastomer actuators 30, then the flexible connector 50 is configured as a part of the first dielectric elastomer film 32, namely, the multiple first dielectric elastomer actuators 30 share a same first dielectric elastomer film 32, and cover an upper part of the gap 23 via the first dielectric elastomer film 32.

The third electrode layer 41, the second dielectric elastomer film 42, and the fourth electrode layer 43 below each of the plurality of the cantilever diaphragms 20 together form a respective second dielectric elastomer actuator 40. The sound production device 10 of the present disclosure includes at least one second dielectric elastomer actuator 40.

Figure 2:
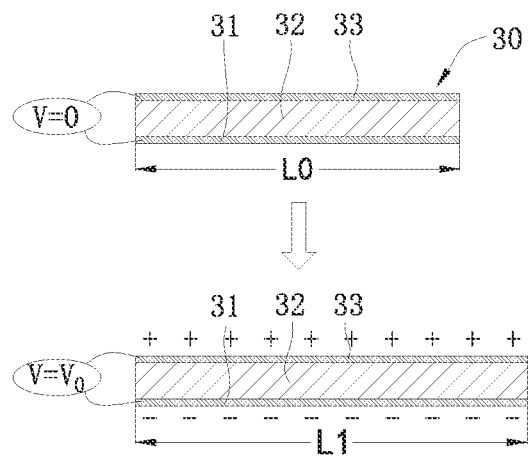
FIG. 2 depicts a principal diagram of dielectric elastomer actuators according to embodiments of the present disclosure.

Dielectric elastomer actuators are a new type of software driver with good scalability, an output of which is stable and easy to control. The at least one first dielectric elastomer actuator 30 above the plurality of the cantilever diaphragms 20 is illustrated for example. As shown in FIG. 2, when a certain electric potential difference is applied to the second electrode layer 33 and the first electrode layer 31, a generated electric field force causes the two electrodes to attract each other and draw closer, thus squeezing the first dielectric elastomer film 32 in the middle, so that the thickness of the dielectric elastomer film 32 is reduced and an inner plane area of the electric elastomer film 32 is increased, which causes an elongation in the longitudinal direction. That is, a length of the dielectric elastomer film 32 is turned from L0 to L1, while at this time, the elongation of the first dielectric elastomer actuator 30 is limited by the first surface of the cantilever diaphragm 20, and thereby a stress force is introduced on the first surface, thus the cantilever diaphragm 20 curves toward a direction of the second surface.

However, as the electric field force of the dielectric elastomer actuators is proportional to a square of an applied voltage ($F \propto V^2$). If only one dielectric elastomer actuator is provided on one surface of each of the cantilever diaphragms 20, then a serious nonlinear problem is generated. Therefore, in the embodiments of the present disclosure, the at least one first dielectric elastomer actuator 30 and the at least one second dielectric elastomer actuator 40 are respectively disposed on the upper and lower surfaces of each of the cantilever diaphragms 20. A drive voltage of the first dielectric elastomer actuator 30 and a drive voltage of the second dielectric elastomer actuator 40 are alternating voltages having a same period and a phase difference of 180°, so that each of the cantilever diaphragms 20 repeatedly vibrates air up and down to produce sounds.

Figure 3:
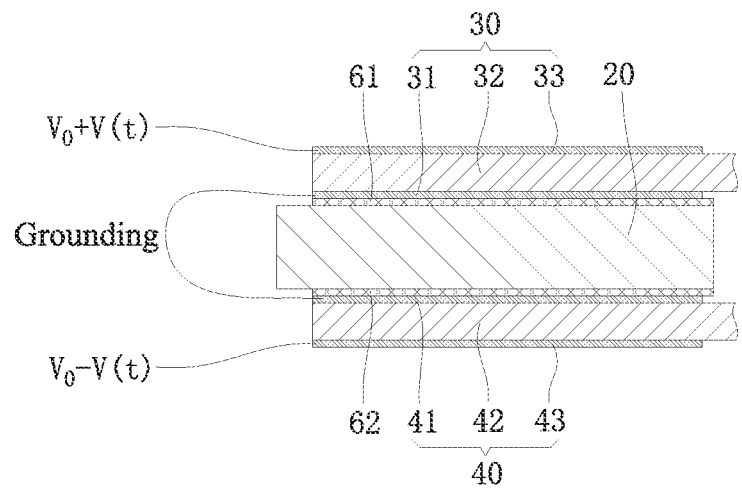
FIG. 3 depicts a signal connection diagram of the sound production device of FIG. 1.
Figure 4:
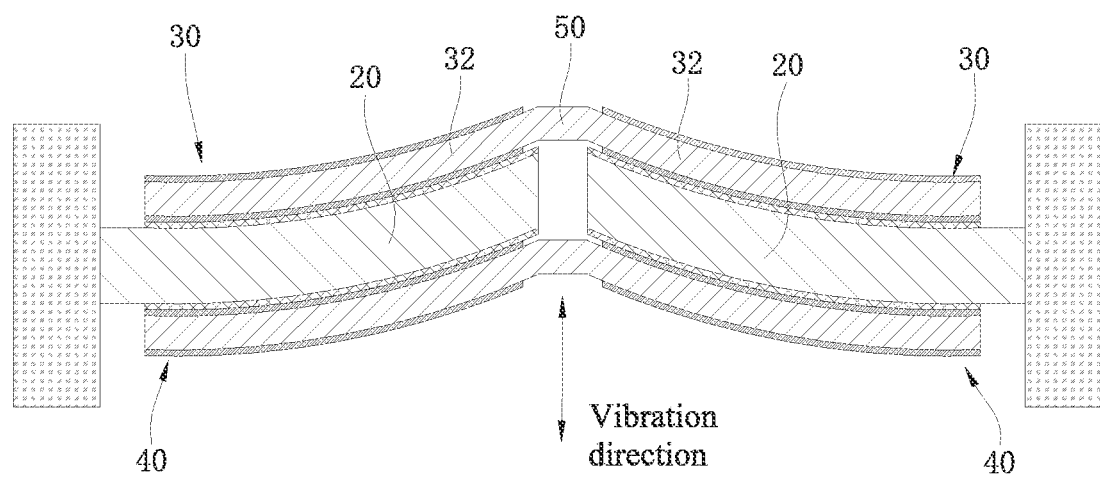
FIG. 4 depicts a diagram of the sound production device of FIG. 1 in a vibration state.

Specifically, a drive signal as shown in FIG. 3 is adopted, that is, an electric field force generated by the at least one first dielectric elastomer actuator 30 is $F1 \propto (V_0+V(t))^2$, and an electric field force generated by the at least one second dielectric elastomer actuator 40 is $F2 \propto (V_0-V(t))^2$. $V_0$ is a DC offset, $V(t)$ is an audio signal, F1 and F2 act on two opposite directions of the cantilever diaphragm 20, a final vibration direction is determined according to a difference value of F1 to F2 (namely F1−F2). As shown in FIG. 4, after the calculation, $F1-F2 \propto 4*V_0*V(t)$, that is, the driving force is linearly related to the audio signal, and the linearity of the sound production device can be greatly improved.

In the embodiment, multiple second dielectric elastomer actuators 42 are provided, the second dielectric elastomer film 42 of each of the multiple second dielectric elastomer actuators 40 forms an integrated structure, and completely cover the gap 23. Therefore, the first dielectric elastomer film 32 and the second dielectric elastomer film 42 can be configured as function of the elastic layer of each of the dielectric elastomer actuators, but also directly cover the gap between the adjacent cantilever diaphragms 20, thus ensuring there is no acoustic leak and making the structure easier.

Further, each of the cantilever diaphragms 20 preferably is made from a polymer compound, for example, any one of polyimide, polyetherimide, polyether ether ketone, polyphenylene sulfide, and thermoplastic elastomer. Each of the cantilever diaphragms 20 can also be a composite layer made from several of the above-described material, and which can be selected by those skilled in the related art according to actual needs, and is not limited by the present disclosure.

In one embodiment, each of the cantilever diaphragms 20 can also be made of metal, for example, any one of aluminum, copper, stainless steel. When each of the cantilever diaphragms 20 is made of metal, a first insulating layer 61 is further disposed between the first surface and the first electrode layer 31, then the connection between the first electrode layer 31 and the metal cantilever diaphragms 20 is isolated. A second insulating layer 62 is further arranged between the second surface and the third electrode layer 41. The connection between the third electrode layer 41 and the metal cantilever film 20 is isolated, thereby avoiding the electrodes of the dielectric elastomer actuators to directly connect with the metal cantilever diaphragms 20 and short circuit problems.

The Young's modulus of the cantilever diaphragm 20 is preferably from 1 MPa to 500 GPa, and the elasticity and rigidity of the cantilever diaphragms 20 are good within the membrane range, so that the polarization of the sound production device is small.

The cavity 11 may be divided into one or more vibration regions, and at least two of the cantilever diaphragms 20 may be provided in each vibration region. In the embodiment, two of the cantilever diaphragms 20 are disposed in a vibration region and are symmetrical with each other. That is, the free ends 22 of the two cantilever diaphragms 20 are paced oppositely to each other, thus forming the gap 23, and the first dielectric elastomer actuators 30 on the upper sides of the two of the cantilever diaphragms 20 share one first dielectric elastomer film 32, the second dielectric elastomer actuators 40 on the lower side of the two of the cantilever films 20 shares one second dielectric elastomer film 42, which optimizes the structure of the sound production device, easily assembles the sound production device, and improves connection strength of each component.

Figure 9:
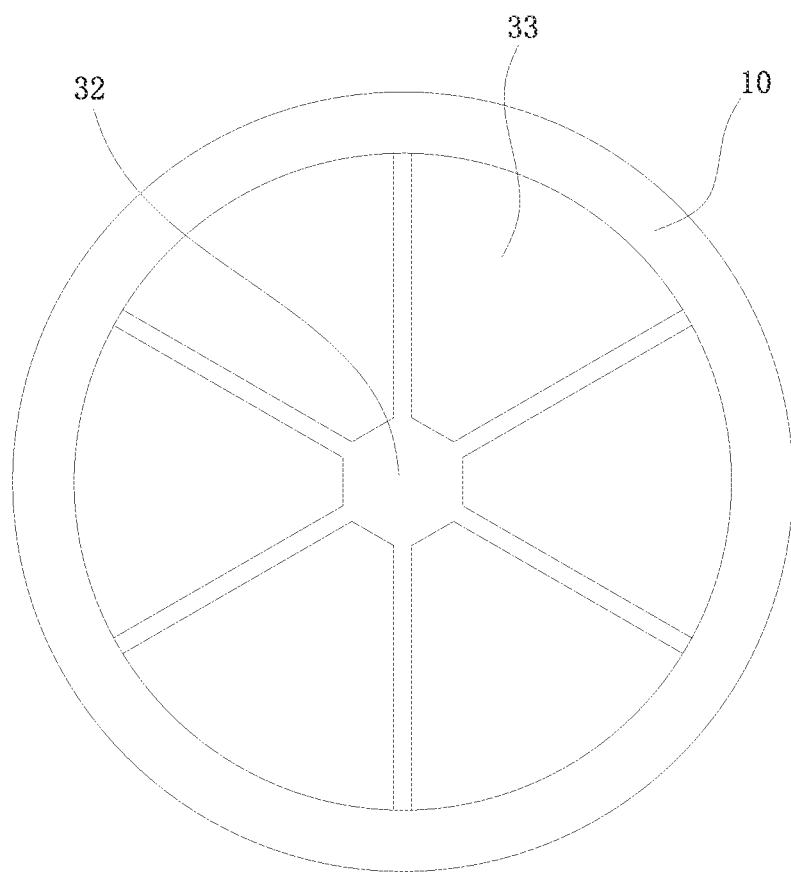
FIG. 9 depicts a top plan view of the sound production device according to embodiments of the present disclosure.

In one embodiment, as shown in FIG. 9, six of the cantilever diaphragms 20 are provided in the cavity 11 of the substrate 10, and the six of cantilever diaphragms 20 are symmetrically distributed around a center axis, and the free ends 22 of the six of the cantilever diaphragms 20 extend toward to a center of the cavity 11 in a tapered manner. That is, each of the cantilever diaphragms 20 is substantially a ladder shape, which includes a first side edge fixed on the substrate 10, a second side edge opposite to the first side edge, and two beveled edges connected to the first side edge and the second side edge. A length of the first side edge is greater than a length of the second side edge. A gap 23 is formed between two adjacent beveled edges of two of the cantilever diaphragms 20. Namely, six gapes 23 are formed through the six of cantilever diaphragms 20. A hexagonal hollow region is formed between six second side edges of the six of the cantilever diaphragms 20 and communicates with the six gaps 23. The first electrode layer 31 is respectively disposed on an upper side of each of the plurality of the cantilever diaphragms 20. An integral first dielectric elastomer film 32 is disposed on upper surfaces of six of the first electrode layers 31. A second electrode layer 33 is respectively disposed corresponding to the first electrode layer 31 at a position on the upper surface of the first dielectric elastomer film 32. A third electrode layer 41 is respectively disposed on a lower side of each of the cantilever diaphragms 20. An integral second dielectric elastomer film 42 is disposed on upper surfaces of six of the third electrode layers 41. A fourth electrode layer 43 is respectively disposed corresponding to the third electrode layer 41 at a position on the upper surface of the second dielectric elastomer film 42. Projection profiles of the first to fourth electrode layer in a vibration direction are same as projection profiles of a respective one of the cantilever diaphragms 20 in the vibration direction, or the projection profiles of the first to fourth electrode layer are similar to the projection profiles of the respective one of the cantilever diaphragms 20 and located in the projection profiles of the respective one of the cantilever diaphragms 20.

Figure 5:
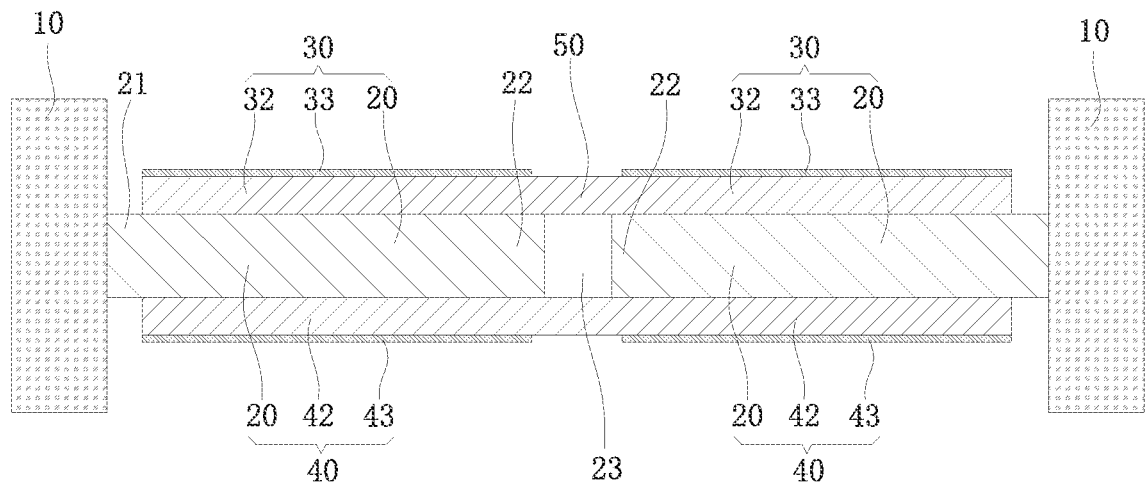
FIG. 5 depicts a structural diagram of a sound production device according to a second embodiment of the present disclosure.

As shown in FIG. 5, the present disclosure provides a second embodiment of the sound production device. A difference of the sound production device from the above-described embodiment is that each of the cantilever diaphragms 20 in the embodiment is made of metal material, and the first electrode layer, the third electrode layer, and the two insulating layers are omitted. Thereby the cantilever diaphragms 20 act as a common electrode. That is, the first dielectric elastomer film 32 and the second electrode layer 33 are directly and sequentially stacked on the upper surface of each of the cantilever diaphragms 20. A respective one of the cantilever diaphragms 20, the respective first dielectric elastomer film 32, and the respective second electrode layer 33 together form the respective first dielectric elastomer actuator 30. The second dielectric elastomer film 42 and the fourth electrode layer 43 are directly and sequentially stacked on the lower surface of each of the cantilever diaphragms 20. A respective one of the cantilever diaphragms 20, the respective second dielectric elastomer film 42, and the respective fourth electrode layer 43 together form the respective second dielectric elastomer actuator 40. So that, the assembly structure is optimized and the line connection is simplified, a thin, smaller sound production device is made and obtained.

Figure 6:
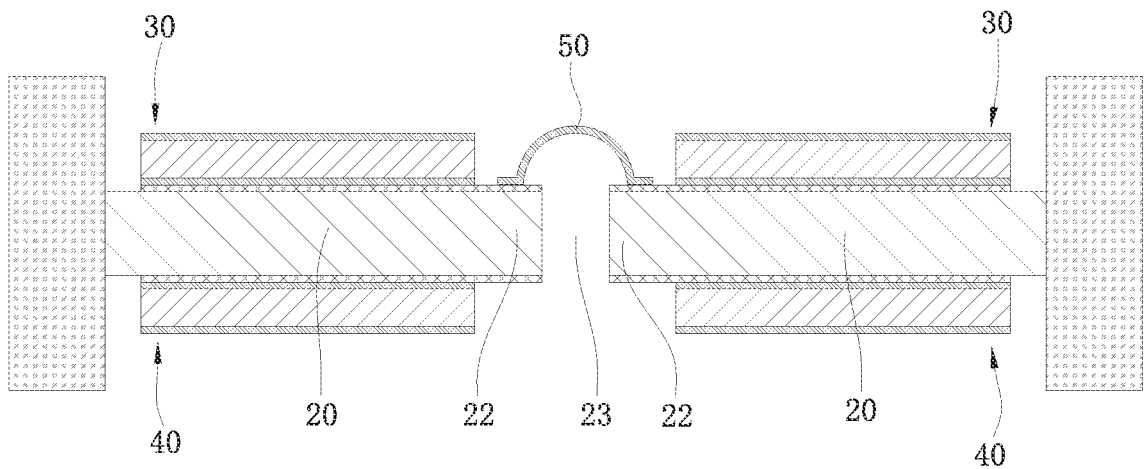
FIG. 6 depicts a structural diagram of a sound production device according to a third embodiment of the present disclosure.
Figure 7:
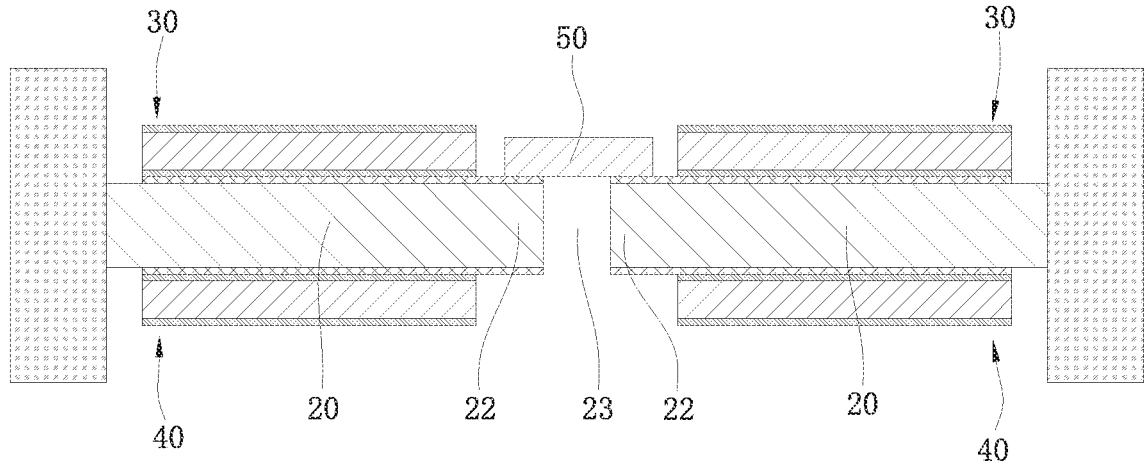
FIG. 7 depicts another structural diagram of a sound production device according to the third embodiment of the present disclosure.

As shown in FIG. 6 and FIG. 7, the present disclosure provides a third embodiment of the sound production device. A difference of the sound production device from the above-described embodiment is that the first dielectric elastomer actuator 30 and the second dielectric elastomer actuator 40 disposed on the upper and lower sides of the cantilever diaphragm 20 in the third embodiment are independent structures. That is, each dielectric elastomer actuator respectively has its own dielectric elastomer film. The sound production device of the embodiment further includes a flexible connector 50 fixed to a periphery of the gap 23 to completely cover the gap 23. The flexible connector 50 is also fixed to the upper surface of each of the cantilever diaphragms 20 and spaced apart from the first dielectric elastomer actuator 30. In one embodiment, the flexible connector 50 is an arch shaped structure as shown in FIG. 6, thereby reducing the rigidity, then improving the amplitude. In other embodiment, the flexible connector 50 is a flat shaped structure as shown in FIG. 7, but not limited to these.

Figure 8:
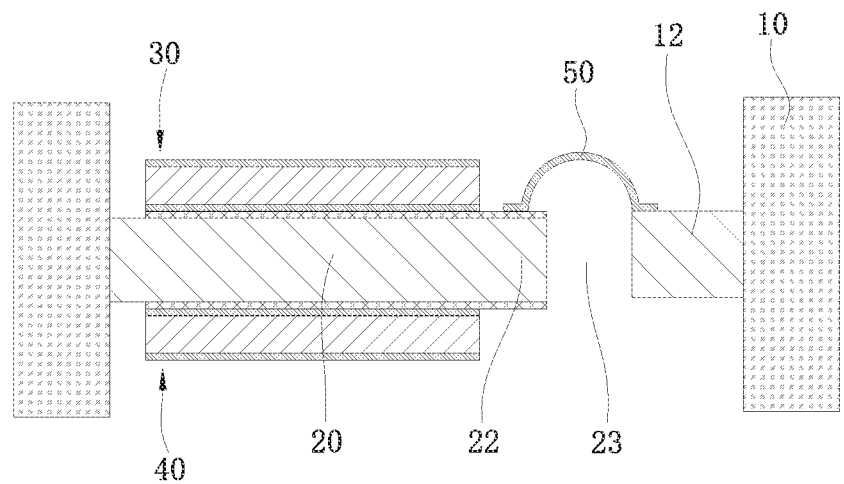
FIG. 8 depicts a structural diagram of a sound production device according to a fourth embodiment of the present disclosure.

As shown in FIG. 8, the present disclosure provides a fourth embodiment of the sound production device. A difference of the sound production device from the above-described embodiment is that the substrate 10 in the cavity 11 in the fourth embodiment protrudes to a direction of each of the cantilever diaphragms 20 to form a support portion 12. The support portion 12 is spaced apart from the free end 22 of each of the cantilever diaphragms 20 and the gap 23 is thereby formed between the support portion 12 and the free end 22. The flexible connector 50 disposed on the free end 22 of each of the cantilever diaphragms 20 and the support portion 12 completely cover the gap 23. Alternatively, the first dielectric elastomer film 32 of the first dielectric elastomer actuator 30 extends and is fixed to the support portion 12 to completely cover the gap 23.

Compared with the related art, the sound production device of the present disclosures adopts dielectric elastomer actuators on both of the upper and lower sides of the cantilever diaphragms 20 to together act on the cantilever diaphragms 20, thus vibrating to produce sounds, and improving the linearity of the sound production device. Because a voice coil and a magnetic circuit system are omitted, the structure of the sound production device becomes easier and more convenient to assembly, and the thickness of the entire vibration component (namely the thickness between the second electrode layer 33 and the fourth electrode layer 43) can be as low as 20 um or less. A thinner size sound production device can be obtained.

In the above embodiment, each of the descriptions of each embodiment have a focus, and a portion thereof will be described in detail in an embodiment, and a description of other embodiments can be found.

The above is a description of the technical solutions provided by the present disclosure, and the idea of the embodiments of the present disclosure will have changes in the specific embodiments and applications, in accordance with the embodiments of the present disclosure, and in summary, the contents of this specification should not It is understood that the limitation of the invention.

What is claimed is:

1. A sound production device comprising:
   a substrate having a cavity;
   a plurality of cantilever diaphragms;
   at least one first dielectric elastomer actuator;
   at least one second dielectric elastomer actuator; and
   a flexible connector;
   wherein the plurality of cantilever diaphragms are fixed on the substrate, each of the plurality of the cantilever diaphragms comprises a fixed end fixed on the substrate and a free end extending from the fixed end to a position suspended over the cavity, the free end comprises a first surface and a second surface where the first surface is opposite to the second surface, the free end is spaced with the substrate or one other the free end to form a gap; the at least one first dielectric elastomer actuator is disposed on the first surface; the at least one second dielectric elastomer actuator is disposed on the second surface; and the flexible connector is fixed on a periphery of the gap to completely cover the gap;
   wherein each of the plurality of the cantilever diaphragms is made of metal or a polymer compound; when the cantilever diaphragms is made of a polymer compound, the at least one first dielectric elastomer actuator comprises a first electrode layer, a first dielectric elastomer film, and a second electrode layer sequentially stacked on the first surface; the at least one second dielectric elastomer actuator comprises a third electrode layer, a second dielectric elastomer film, and a fourth electrode layer sequentially stacked on the second surface;
   when the cantilever diaphragms is made of a conductive metal material, the at least one first dielectric elastomer actuator comprises a first dielectric elastomer film and a second electrode layer sequentially stacked on the first surface; the at least one second dielectric elastomer actuator comprises a second dielectric elastomer film and a fourth electrode layer sequentially stacked on the second surface;
   and the first dielectric elastomer film and the second dielectric elastomer film are made of polymer compound;
   the flexible connector is integrally formed with the first dielectric elastomer film of the at least one first dielectric elastomer actuator; each of the second dielectric elastomer film of the at least one second dielectric elastomer actuator is interconnected to form an integral structure.

2. The sound production device according to claim 1, wherein the flexible connector is a flat or arch shaped structure and is spaced from the at least one first dielectric elastomer actuator.

3. The sound production device according to claim 1, wherein a drive voltage of the at least one first dielectric elastomer actuator and a drive voltage of the at least one second dielectric elastomer actuator are alternating voltages having a same period and a phase difference of 180°.

4. The sound production device according to claim 1, wherein the plurality of the cantilever diaphragms are symmetrically distributed around a central axis, and the free end of each of the cantilever diaphragms extends toward a center of the cavity in a tapered manner.

5. The sound production device according to claim 1, wherein Young's modulus of the first dielectric elastomer film and Young's modulus of the second dielectric elastomer film are from 1 kPa to 100 MPa.

6. The sound production device according to claim 1, wherein when one of the plurality of the cantilever diaphragms is made of a conductive metal material, a first insulating layer and a first electrode layer are sequentially stacked between the first surface and the first dielectric elastomer film, and a second insulating layer and a third electrode layer are sequentially stacked between the second surface and the second dielectric elastomer film.

* * * * *